(12) United States Patent
Yen

(10) Patent No.: US 11,670,446 B2
(45) Date of Patent: Jun. 6, 2023

(54) HELICAL STACKED INTEGRATED INDUCTOR AND TRANSFORMER

(71) Applicant: REALTEK SEMICONDUCTOR CORPORATION, Hsinchu (TW)

(72) Inventor: Hsiao-Tsung Yen, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 260 days.

(21) Appl. No.: 17/085,039

(22) Filed: Oct. 30, 2020

(65) Prior Publication Data
US 2021/0050144 A1 Feb. 18, 2021

Related U.S. Application Data

(62) Division of application No. 15/293,101, filed on Oct. 13, 2016, now Pat. No. 10,867,742.

(30) Foreign Application Priority Data

Dec. 8, 2015 (TW) .................. 104141141

(51) Int. Cl.
| | |
|---|---|
| *H01F 27/29* | (2006.01) |
| *H01F 27/28* | (2006.01) |
| *H01L 23/52* | (2006.01) |
| *H01L 49/02* | (2006.01) |
| *H01L 23/522* | (2006.01) |

(52) U.S. Cl.
CPC ......... *H01F 27/29* (2013.01); *H01F 27/2804* (2013.01); *H01L 23/5227* (2013.01); *H01L 28/10* (2013.01); *H01F 2027/2809* (2013.01)

(58) Field of Classification Search
CPC ............... H01F 27/29; H01F 27/2804; H01F 2027/2809; H01L 23/5227; H01L 28/10
See application file for complete search history.

(56) References Cited

U.S. PATENT DOCUMENTS

| | | | |
|---|---|---|---|
| 4,613,843 A | * | 9/1986 | Esper ............... H02K 3/26 336/200 |
| 5,656,849 A | | 8/1997 | Burghartz et al. |
| 6,603,383 B2 | | 8/2003 | Gevorgian et al. |

(Continued)

FOREIGN PATENT DOCUMENTS

| | | |
|---|---|---|
| CN | 101145435 A | 3/2008 |
| CN | 101331586 A | 12/2008 |

(Continued)

*Primary Examiner* — Mohamad A Musleh
*Assistant Examiner* — Malcolm Barnes
(74) *Attorney, Agent, or Firm* — WPAT, P.C

(57) ABSTRACT

A helical stacked integrated inductor formed by a first inducing unit and a second inducing unit includes a first helical coil and a second helical coil. The first helical coil is substantially located at a first plane and includes a first outer turn and a first inner turn. The first inner turn is surrounded by the first outer turn. The first helical coil forms a part of the first inducing unit and a part of the second inducing unit. The second helical coil is substantially located at a second plane different from the first plane and overlaps the first helical coil. The second helical coil forms a part of the first inducing unit and a part of the second inducing unit. The first helical coil and the second helical coil are stacked in a staggered arrangement.

5 Claims, 11 Drawing Sheets

⊠ through position

(56) References Cited

U.S. PATENT DOCUMENTS

| | | | |
|---|---|---|---|
| 6,608,364 B2* | 8/2003 | Carpentier | H01L 28/10 |
| | | | 336/200 |
| 6,927,664 B2* | 8/2005 | Nakatani | H01P 5/10 |
| | | | 336/200 |
| 7,312,684 B2* | 12/2007 | Aoki | H01L 23/5227 |
| | | | 336/200 |
| 7,382,222 B1* | 6/2008 | Manetakis | H01F 17/0006 |
| | | | 336/200 |
| 7,482,904 B2* | 1/2009 | Lee | H03H 7/42 |
| | | | 336/200 |
| 7,626,480 B2 | 12/2009 | Lee | |
| 7,633,368 B2* | 12/2009 | Lee | H01F 17/0006 |
| | | | 336/200 |
| 8,183,971 B2 | 5/2012 | Le Guillou et al. | |
| 8,198,970 B2 | 6/2012 | Choi et al. | |
| 9,865,392 B2* | 1/2018 | Groves | H01F 17/0033 |
| 9,922,763 B2* | 3/2018 | Chen | H01F 27/2804 |
| 10,283,257 B2* | 5/2019 | Kim | H01F 27/2804 |
| 10,340,880 B2 | 7/2019 | Yen | |
| 2002/0101322 A1* | 8/2002 | Liu | H01F 17/0013 |
| | | | 257/E27.046 |
| 2002/0113682 A1* | 8/2002 | Gevorgian | H03H 7/422 |
| | | | 336/200 |
| 2003/0085788 A1* | 5/2003 | Yue | H03F 3/45183 |
| | | | 336/200 |
| 2004/0075521 A1* | 4/2004 | Yu | H01L 27/08 |
| | | | 336/200 |
| 2006/0077028 A1* | 4/2006 | Huang | H01F 17/0006 |
| | | | 336/223 |
| 2007/0247269 A1* | 10/2007 | Papananos | H01L 23/5227 |
| | | | 336/200 |
| 2009/0284339 A1* | 11/2009 | Choi | H03H 7/42 |
| | | | 336/200 |
| 2009/0289727 A1 | 11/2009 | El Rai | |
| 2010/0117737 A1 | 5/2010 | Kondo et al. | |
| 2014/0070913 A1 | 3/2014 | Beer et al. | |
| 2015/0091687 A1* | 4/2015 | Valentin | H01L 23/5227 |
| | | | 336/200 |
| 2015/0130579 A1 | 5/2015 | Kim et al. | |
| 2015/0310980 A1 | 10/2015 | Yen et al. | |
| 2016/0027571 A1* | 1/2016 | Zhang | H01F 19/04 |
| | | | 336/173 |
| 2017/0117079 A1 | 4/2017 | Yen et al. | |
| 2017/0162318 A1 | 6/2017 | Yen | |
| 2018/0151287 A1 | 5/2018 | Yosui et al. | |

FOREIGN PATENT DOCUMENTS

| | | | | |
|---|---|---|---|---|
| CN | 103779320 A | 5/2014 | | |
| CN | 105023739 A | 11/2015 | | |
| CN | 105023739 A | 11/2015 | | |
| CN | 109860146 | 6/2019 | | |
| EP | 1085538 A1 * | 3/2001 | | H01F 27/2804 |
| JP | 2001-60515 A | 3/2001 | | |
| TW | 201335957 | 9/2013 | | |
| TW | 201335957 A | 9/2013 | | |
| TW | 201541476 A | 11/2015 | | |

* cited by examiner

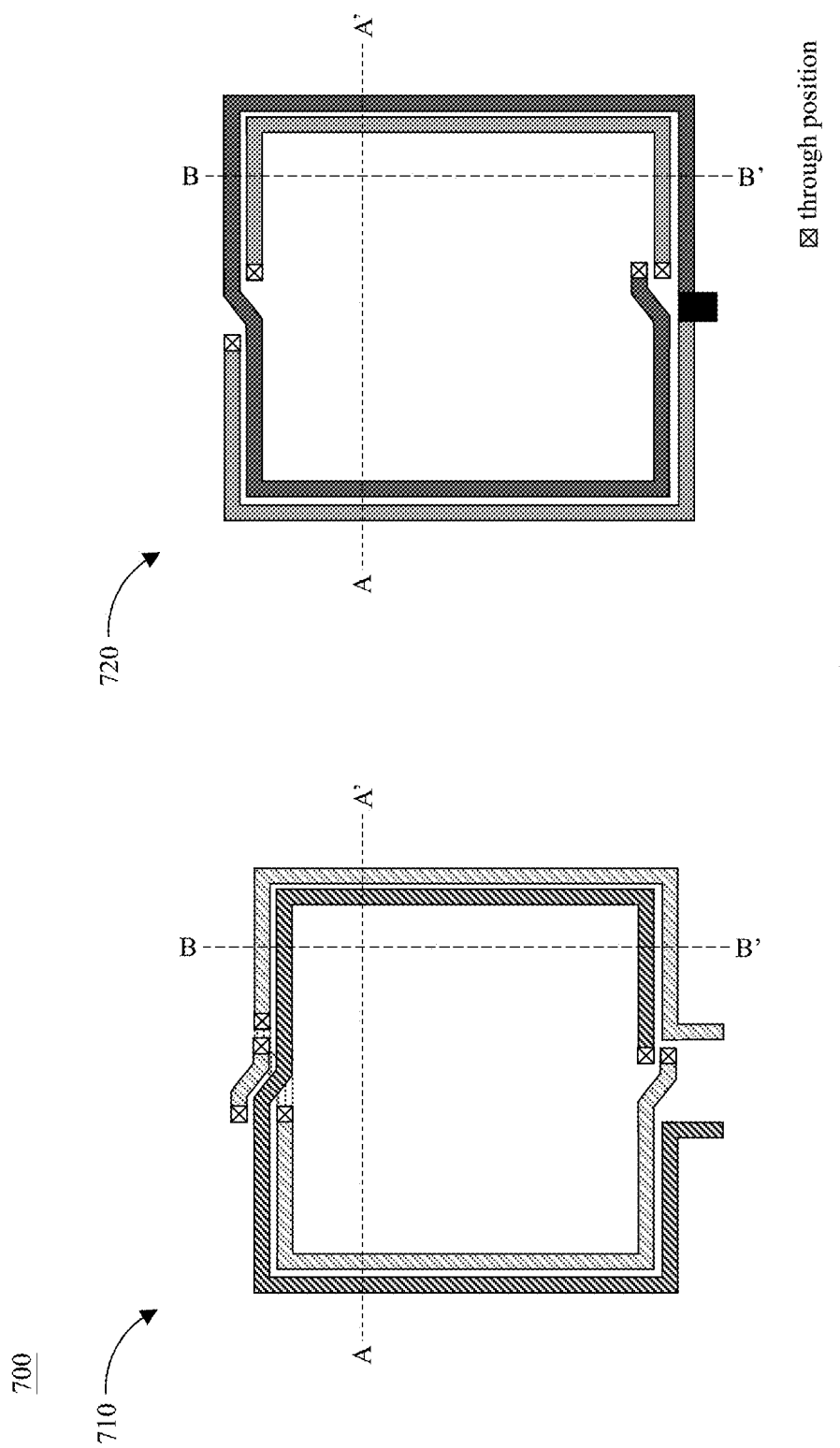

HELICAL STACKED INTEGRATED INDUCTOR AND TRANSFORMER

BACKGROUND OF THE INVENTION

1. Field of the Invention

The present invention relates to a transformer and an inductor, especially to a helical stacked integrated transformer and a helical stacked integrated inductor.

2. Description of Related Art

Inductors and transformers are important elements in radio frequency integrated circuits to implement single-ended to differential signal conversion, signal coupling and impedance matching. As System-on-chips (SoC) become the mainstream of integrated circuits, integrated inductors and integrated transformers gradually substitute conventional discrete elements and are commonly applied to radio frequency integrated circuits. However, inductors and transformers in integrated circuits often take up large areas; therefore, it becomes an important issue to reduce the areas of inductors and transformers in integrated circuits without degrading element performances, such as inductance, quality factor (Q), and coupling coefficient (K).

SUMMARY OF THE INVENTION

In view of the issues of the prior art, an object of the present invention is to provide a helical stacked integrated transformer and a helical stacked integrated inductor in order to reduce component areas and enhance component performances, and further to improve symmetry of the components.

A helical stacked integrated transformer is disclosed. The helical stacked integrated transformer is formed by a first inductor and a second inductor and comprises a first helical coil and a second helical coil. The first helical coil is substantially located at a first plane and has a first outer turn and a first inner turn. The first inner turn is surrounded by the first outer turn, and the first helical coil forms a part of the first inductor and a part of the second inductor. The second helical coil is substantially located at a second plane different from the first plane, and shares an overlapped region with the first helical coil. The second helical coil forms a part of the first inductor and a part of the second inductor. At least one side of the first outer turn corresponds to a metal segment of the second helical coil along one direction, and at least one side of the first inner turn does not correspond to the metal segment of the second helical coil along the direction. The direction is a direction perpendicular to the first plane or the second plane.

A helical stacked integrated inductor is also disclosed. The helical stacked integrated inductor is formed by a first inducing unit and a second inducing unit and comprises a first helical coil and a second helical coil. The first helical coil is substantially located at a first plane and has a first outer turn and a first inner turn. The first inner turn is surrounded by the first outer turn, and the first helical coil forms a part of the first inducing unit and a part of the second inducing unit. The second helical coil is substantially located at a second plane different from the first plane, and shares an overlapped region with the first helical coil. The second helical coil forms a part of the first inducing unit and a part of the second inducing unit. At least one side of the first outer turn corresponds to a metal segment of the second helical coil along one direction, and at least one side of the first inner turn does not correspond to the metal segment of the second helical coil along the direction. The direction is a direction perpendicular to the first plane or the second plane.

The disclosed helical stacked integrated transformer and the helical stacked integrated inductor have symmetric integrated structures, thereby providing two highly symmetric inductors or inducing units. By arranging two helical coils in a staggered manner, the terminals of the integrated transformer and the integrated inductor are located at the outermost turn of the helical coil, which reduces winding complexity of the helical coil. In comparison to a conventional single-layered integrated inductor having the same inductance value and quality factor (Q), this invention greatly reduces component areas.

These and other objectives of the present invention no doubt become obvious to those of ordinary skill in the art after reading the following detailed description of the preferred embodiments with reference to the various figures and drawings.

BRIEF DESCRIPTION OF THE DRAWINGS

FIGS. 7A-7C illustrates a helical stacked integrated inductor and its cross-sectional views according to another embodiment.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

Figure 1:
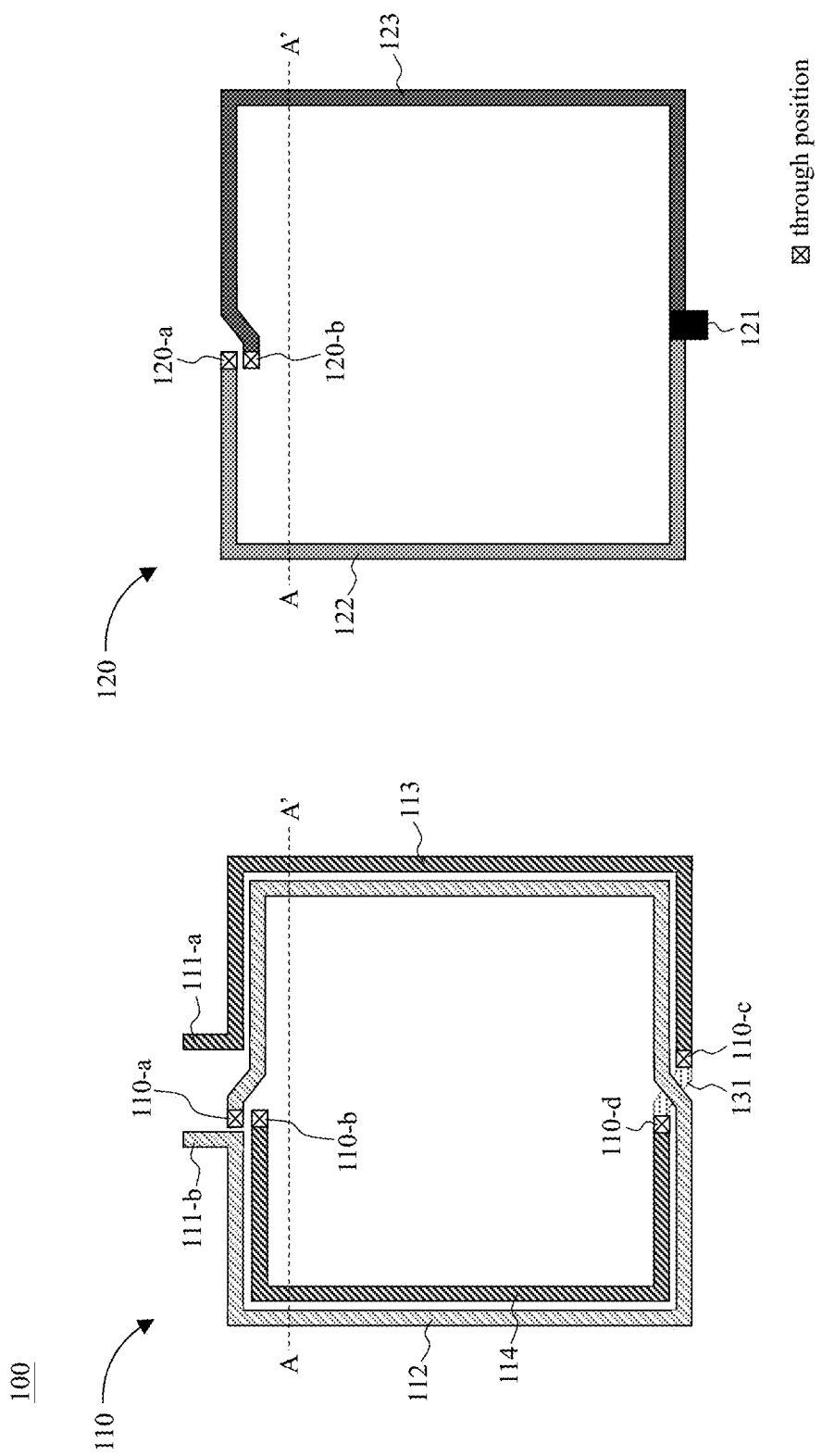
FIG. 1 illustrates a helical stacked integrated inductor according to an embodiment.

FIG. 1 illustrates a helical stacked integrated inductor according to an embodiment. The helical stacked integrated inductor 100 is made up of a helical coil 110 and a helical coil 120. Most metal segments of the helical coil 110 are located in a first metal layer of a semiconductor structure, and most metal segments of the helical coil 120 are located in a second metal layer of the semiconductor structure. In other words, the helical coil 110 is substantially located at a plane where the first metal layer exists, and the helical coil 120 is substantially located at a plane where the second metal layer exists. The helical coil 110 has a terminal 111-*a*, a terminal 111-*b*, and metal segments 112, 113, 114 and 131. Except the metal segment 131 that is located in a third metal layer different from the first and second metal layers, the remaining metal segments and all of the terminals are located in the first metal layer. The metal segment 131 connects the metal segment 113 and the metal segment 114 through a via structure or a via array at the through positions 110-*c* and 110-*d*, respectively. The helical coil 120 has a terminal 121 and two metal segments 122 and 123. The terminal 121 and the metal segments 122 and 123 are located in the second metal layer.

The helical stacked integrated inductor 100 includes two inducing units, which are the first inducing unit (represented by metal segments in light grey) and the second inducing unit (represented by metal segments in dark grey). The current flowing into the first inducing unit through the terminal 111-*b* passes the metal segment 112, and flows to the metal segment 122 through the via structure or the via array at the through positions 110-*a* and 120-*a* before flowing out through the terminal 121. Likewise, the current flowing into the second inducing unit through the terminal 111-*a* passes the metal segments 113, 131 and 114, and flows to the metal segment 123 through the via structure or the via array at the through positions 110-*b* and 120-*b* before flowing out through the terminal 121. In fact, the terminal 121 is the center tap of the helical stacked integrated inductor 100, and can be connected to a voltage source or ground of an application circuit employing the helical stacked integrated inductor 100. Obviously, the first inducing unit mainly includes a half of an outer turn of the helical coil 110 (i.e., the part of the metal segment 112 located at the outer turn), a half of an inner turn of the helical coil 110 (i.e., the part of the metal segment 112 located at the inner turn), and a half of the helical coil 120 (i.e., the metal segment 122). The second inducing unit mainly includes the other half of the outer turn of the helical coil 110 (i.e., the metal segment 113), the other half of the inner turn of the helical coil 110 (i.e., the metal segment 114), and the other half of the helical coil 120 (i.e., the metal segment 123). In other words, most metal segments of the two inducing units of the helical stacked integrated inductor 100 are evenly distributed in two metal layers, and thus the two inducing units have excellent symmetry, hence providing the two inducing units with similar quality factors and inductance values. If, on the contrary, most metal segments of one of the two inducing units are located in the first metal layer while most metal segments of the other are located in the second metal layer, the two inducing units may probably be more distinct from each other in terms of quality factors and inductance values due to different characteristics (e.g., thickness, distance from the substrate, and the like) of the two metal layers.

Figure 2:
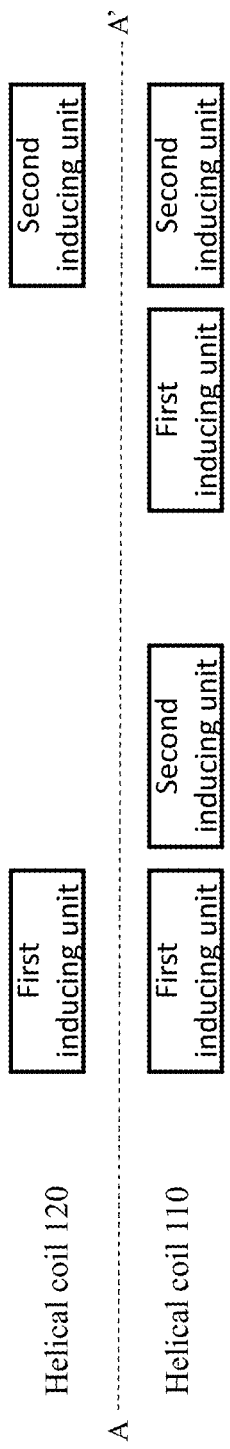
FIG. 2 illustrates a cross-sectional view of the helical stacked integrated inductor 100.

In fact, the helical coil 110 and the helical coil 120 are stacked structures. The part of the metal segment 112 at the outer turn is overlapped without coming into contact with most part of the metal segment 122, and the metal segment 113 is overlapped without coming into contact with most part of the metal segment 123. FIG. 2 is a cross-sectional view of the helical stacked integrated inductor 100 (depicted with respect to the cross section A-A' in FIG. 1). In FIG. 2, the first metal layer (i.e., the metal layer where the helical coil 110 exists) is under the second metal layer (i.e., the metal layer where the helical coil 120 exists). For example, the first metal layer may be the Ultra-Thick Metal (UTM) layer of a semiconductor process, and the second metal layer may be the redistribution layer (RDL) of the semiconductor process. The two layers can be exchanged in other embodiments. In other embodiments, an under bump metallization (UBM) layer, stacked inter-metal layers, a second RDL, or other similar metal layers can also be used. As shown in FIG. 2, the helical coil 110 has one more turn than the helical coil 120. The outer turn of the helical coil 110 is overlapped without coming into contact with the helical coil 120 along a direction perpendicular to the plane where the helical coil 110 or the helical coil 120 exists (with an oxide layer in a semiconductor structure sandwiched between the two helical coils, for example), and the inner turn of the helical coil 110 does not correspond to any metal segment of the helical coil 120 along the same perpendicular direction. With this staggered arrangement (i.e., the two helical coils of the helical stacked integrated inductor 100 have different numbers of turns, and a part of the metal segments of the helical coil with more turns (the metal segment of the inner turn in this embodiment) does not correspond to the metal segments of the other helical coil), the helical stacked integrated inductor 100 has an advantage, in addition to great symmetry, of being able to have its center tap (i.e., the terminal 121) arranged at an outer side of the helical coil; thus there is no need to use another metal layer other than the first and second metal layers to implement the center tap.

Figure 3:
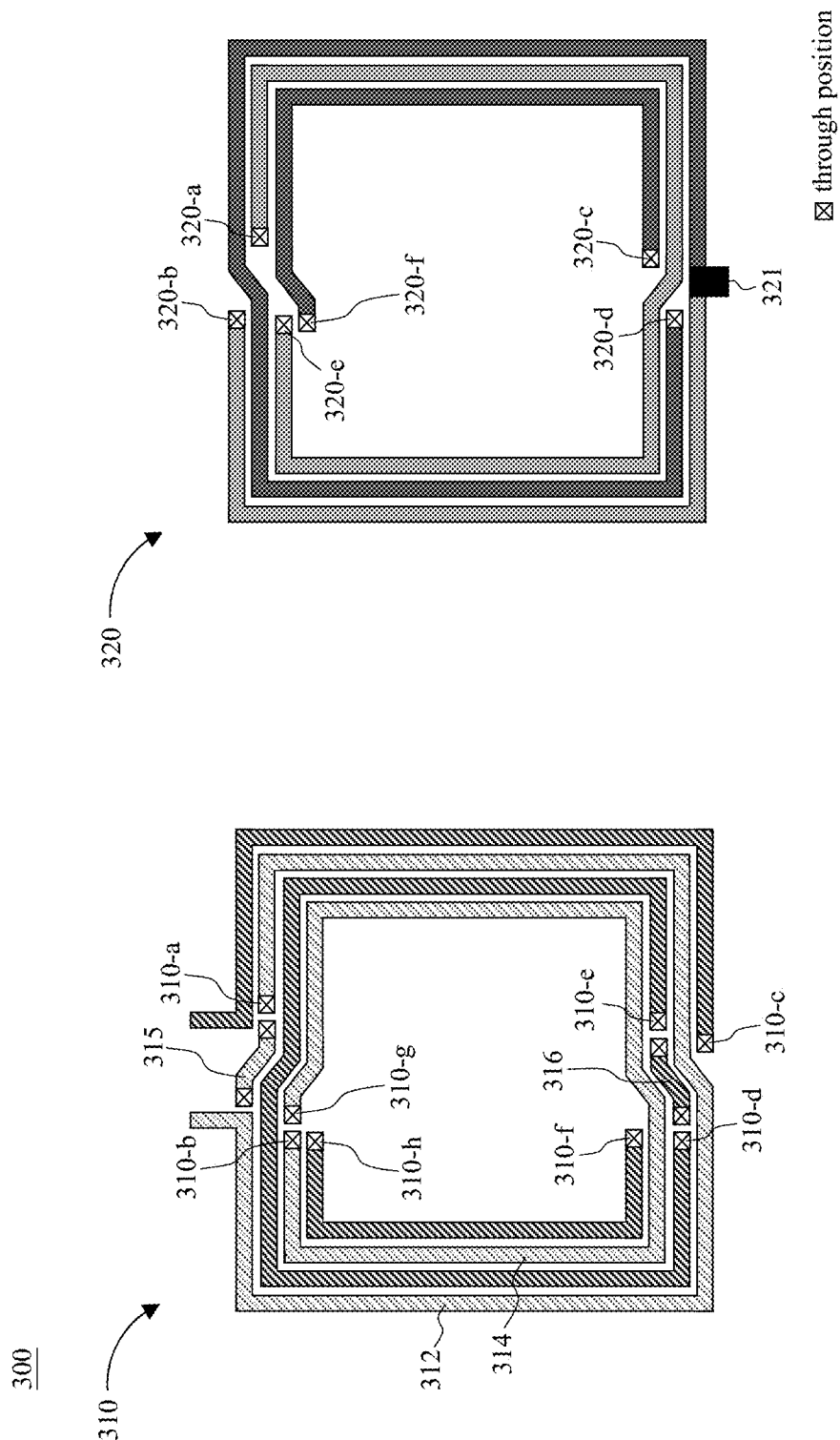
FIG. 3 illustrates a helical stacked integrated inductor according to another embodiment.

The helical stacked integrated inductor of this invention is not limited to a two-turn to one-turn combination as shown in FIG. 1. As shown in FIG. 3, the helical stacked integrated inductor 300 is made up of helical coils 310 and 320, which are respectively four-turn and three-turn structures. Most metal segments of the helical coil 310 are located in the first metal layer, and most metal segments of the helical coil 320 are located in the second metal layer. Some of the metal segments of the helical coil 310 are connected through a metal segment in a third metal layer (the metal segments in the third metal layer are not shown for the reason of clarity); for example, the metal segments 312 and 314 are connected by a metal segment in the third metal layer via a pair of through structures 310-*a* and 310-*b*. Similarly, the through structures 310-*c* and 310-*d* are set as one pair, and the through structures 310-*e* and 310-*f* are set as one pair. Likewise, in the helical coil 320, the through structures 320-*a* and 320-*b*, which respectively correspond to the through structures at two ends of the metal segment 315 of the helical coil 310, are set as one pair, and the through structures 320-*c* and 320-*d*, which respectively correspond to the through structures at two ends of the metal segment 316 of the helical coil 310, are set as one pair. The first inducing unit (represented by metal segments in light grey) has a first part located at the helical coil 310 and a second part located at the helical coil 320, and the first and second parts are connected via corresponding through structures 310-*g* and 320-*e*. The second inducing unit (represented by metal segments in dark grey) has a first part located at the helical coil 310 and a second part located at the helical coil 320, and the first and second parts are connected via corresponding through structures 310-*h* and 320-*f*. As shown in FIG. 3, both the helical coil 310 and the helical coil 320 include multiple turns. In each turn, about a half of the length of the metal segment belongs to the first inducing unit and the other half belongs to the second inducing unit, resulting in excellent symmetry of the helical stacked integrated inductor 300. In addition, in spite of being formed in a structure with multiple turns, the helical stacked integrated inductor 300 can still have its center tap (i.e., the terminal 321) fabricated at the outermost turn of the helical coil 320 to diminish winding complexity. In this embodiment, because there is one turn difference between the helical coils 310 and 320, when they are stacked, the metal segments at the innermost turn of the helical coil 310 does not correspond to any metal segment of the helical coil 320 along a direction perpendicular to a plane where the helical coil 310 or the helical coil 320 exists.

Figure 4:
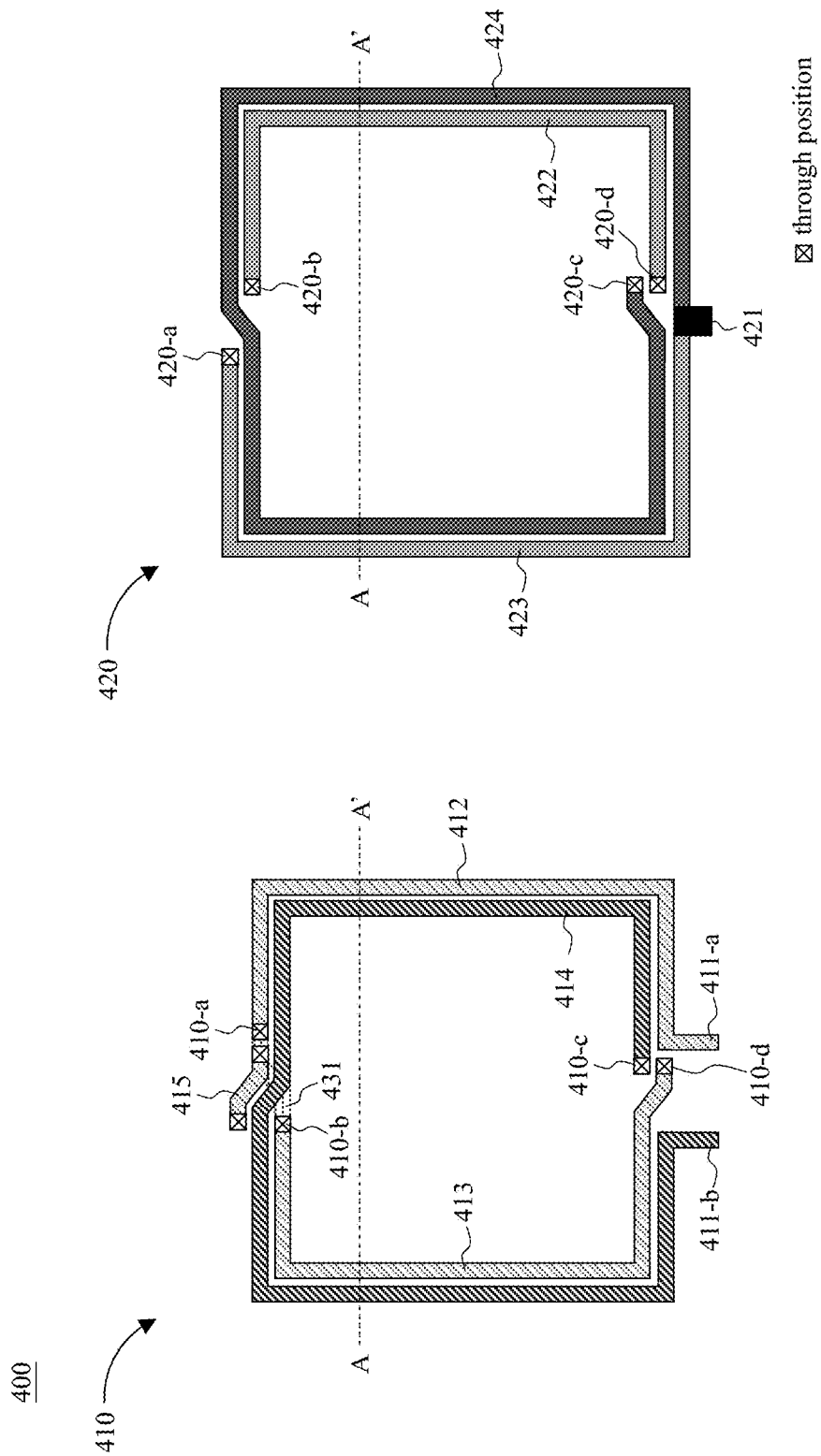
FIG. 4 illustrates a helical stacked integrated inductor according to another embodiment.

In the embodiments of FIGS. 1 and 3, the input terminal and the center tap of the helical stacked integrated inductor are located at different sides of the helical stacked integrated inductor; in another embodiment, they can be located at the same side of the helical stacked integrated inductor, as shown in FIG. 4. The helical stacked integrated inductor 400 is made up of the helical coil 410 and the helical coil 420. Most metal segments of the helical coil 410 are located in the first metal layer of a semiconductor structure, and most metal segments of the helical coil 420 are located in the second metal layer of the semiconductor structure. The helical coil 410 has a terminal 411-a and a terminal 411-b, and further includes metal segments 412, 413, 414, 415, and 431. Except the metal segment 431 that is located in a third metal layer different from the first and second metal layers, the remaining metal segments and all terminals are located in the second metal layer. The metal segment 431 connects the metal segment 412 and the metal segment 413 through the via structure or via array at the through positions 410-a and 410-b, respectively. The helical coil 420 has a terminal 421, and further includes metal segments 422, 423 and 424. The terminal 421 and the metal segments 422, 423, and 424 are located in the second metal layer.

The helical stacked integrated inductor 400 includes two inducing units, which are a first inducing unit (represented by metal segments in light grey) and a second inducing unit (represented by metal segments in dark grey). The current flowing into the first inducing unit through the terminal 411-a passes the metal segments 412, 431 and 413, and flows to the helical coil 420 through the via structure or the via array at the corresponding through positions 410-d and 420-d. The through positions 420-a and 420-b of the helical coil 420 respectively correspond to the through positions at two ends of the metal segment 415 of the helical coil 410. As a result, the current flowing into the helical coil 420 flows through the metal segments 422 and 423 before flowing out through the center tap (i.e., the terminal 421) of the helical stacked integrated inductor 400. Likewise, the current flowing into the second inducing unit through the terminal 411-b passes the metal segment 414, and flows to the metal segment 424 of the helical coil 420 through the via structure or the via array at the through positions 410-c and 420-c before flowing out through the terminal 421. Obviously, the first inducing unit mainly includes a half of an outer turn of the helical coil 410 (i.e., the metal segment 412), a half of an inner turn of the helical coil 410 (i.e., the metal segment 413), a half an outer turn of the helical coil 420 (i.e., the metal segment 423), and a half an inner turn of the helical coil 420 (i.e., the metal segment 422). The second inducing unit mainly includes the other half of the outer turn of the helical coil 410 (i.e., the part of the metal segment 414 at the outer turn), the other half of the inner turn of the helical coil 410 (i.e., the part of the metal segment 414 at the inner turn), the other half of the outer turn of the helical coil 420 (i.e., the part of the metal segment 424 at the outer turn), and the other half of the inner turn of the helical coil 420 (i.e., the part of the metal segment 424 at the inner turn). In other words, most metal segments of the two inducing units of the helical stacked integrated inductor 400 are evenly distributed in two metal layers, and thus the two inducing units have excellent symmetry, hence providing the two inducing units with similar quality factors and inductance values.

Figure 5:
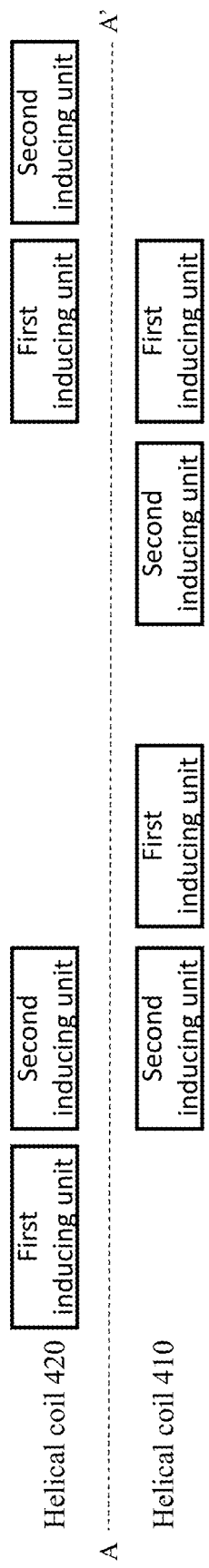
FIG. 5 illustrates a cross-sectional view of the helical stacked integrated inductor 400.

In fact, the helical coil 410 and the helical coil 420 are stacked structures. The outer turn of the helical coil 410 is overlapped without coming into contact with the inner turn of the helical coil 420. FIG. 5 is a cross-sectional view of the helical stacked integrated inductor 400 (depicted with respect to the cross section A-A' in FIG. 4). In FIG. 5, the first metal layer (i.e., the metal layer where the helical coil 410 exists) is under the second metal layer (i.e., the metal layer where the helical coil 420 exists). The two layers can be exchanged in other embodiments. As shown in FIG. 5, although the helical coil 410 and the helical coil 420 are both two-turn structures, the coverage of the helical coil 420 is greater than that of the helical coil 410. To be specific, the outer turn of the helical coil 410 is overlapped without coming into contact with the inner turn of the helical coil 420 along a direction perpendicular to a plane where the helical coil 410 or helical coil 420 exists, the inner turn of the helical coil 410 does not correspond to any metal segment of the helical coil 420 along the same direction, and the outer turn of the helical coil 420 does not correspond to any metal segment of the helical coil 410 along the same direction. With the staggered arrangement (i.e., the two helical coils of the helical stacked integrated inductor 400 have the same number of turns but different coverages, and the innermost turn of the helical coil with smaller coverage and the outermost turn of the helical coil with greater coverage do not correspond to any metal segment of the other helical coil), the helical stacked integrated inductor 400 has an advantage, in addition to great symmetry, of being able to have its center tap (i.e., the terminal 421) arranged at an outer side of the helical coil. Therefore, there is no need to use another metal layer other than the first and second metal layers to implement the center tap.

Figure 6:
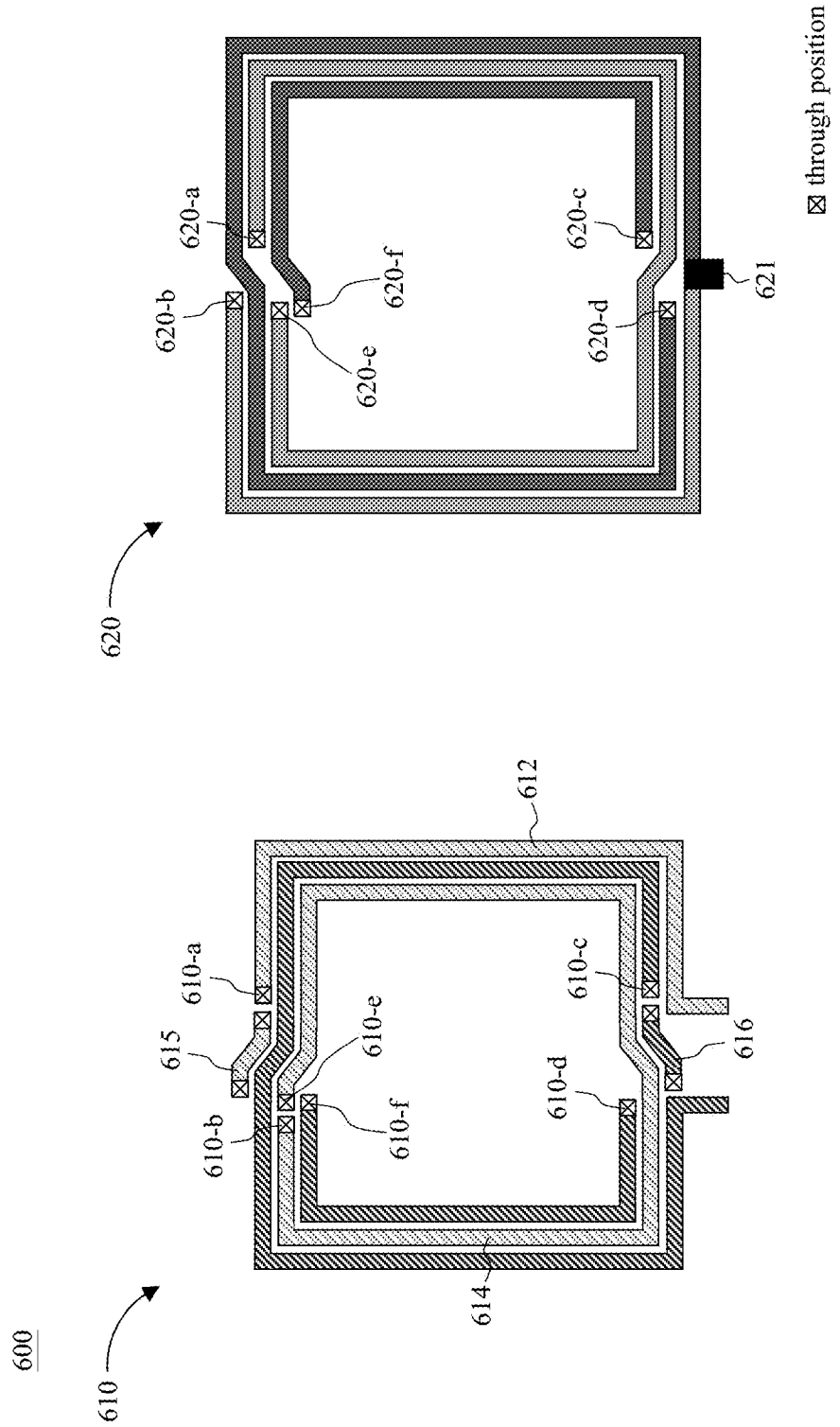
FIG. 6 illustrates a helical stacked integrated inductor according to another embodiment.

The helical stacked integrated inductor of this invention is not limited to the two-turn-and-two-turn combination shown in FIG. 4, and may be a combination of more turns. As shown in FIG. 6, the helical stacked integrated inductor 600 is made up of helical coils 610 and 620, which are respectively three-turn structures. Most metal segments of the helical coil 610 are located in the first metal layer, and most metal segments of the helical coil 620 are located in the second metal layer. Some of the metal segments of the helical coil 610 are connected through a third metal layer (the metal segments in the third metal layer are not shown for the reason of clarity); for example, the metal segments 612 and 614 are connected by a metal segment in the third metal layer via a pair of through structures 610-a and 610-b. Similarly, the through structures 610-c and 610-d are set as one pair. Likewise, in the helical coil 620, the through structures 620-a and 620-b, which respectively correspond to the through structures at two ends of the metal segment 615 of the helical coil 610, are set as one pair, and the through structures 620-c and 620-d, which respectively correspond to the through structures at two ends of the metal segment 616 of the helical coil 610, are set as one pair.

The first inducing unit (represented by metal segments in light grey) has a first part located at the helical coil 610 and a second part located at the helical coil 620, and the first and second parts are connected via corresponding through structures 610-e and 620-e. The second inducing unit (represented by metal segments in dark grey) has a first part located at the helical coil 610 and a second part located at the helical coil 620, and the first and second parts are connected via corresponding through structures 610-f and 620-f. As shown in FIG. 6, both the helical coil 610 and the helical coil 620 include multiple turns. In each turn, about a half of the length of the metal segment belongs to the first inducing unit and the other half belongs to the second inducing unit, resulting in excellent symmetry of the helical stacked integrated inductor 600. In addition, in spite of being formed in a structure with multiple turns, the helical stacked integrated inductor 600 can still have its center tap 621 fabricated at the outermost turn of the helical coil 620 to diminish winding complexity. In this embodiment, the helical coils 610 and 620 have the same number of turns; as a result, when they are stacked, the metal segments at the innermost turn of the helical coil 610 and the metal segments at the outermost turn of the helical coil 620 do not correspond to any metal segment of the other helical coil along a direction perpendicular to a plane where the helical coil 610 or the helical coil 620 exists.

Figure 7B:
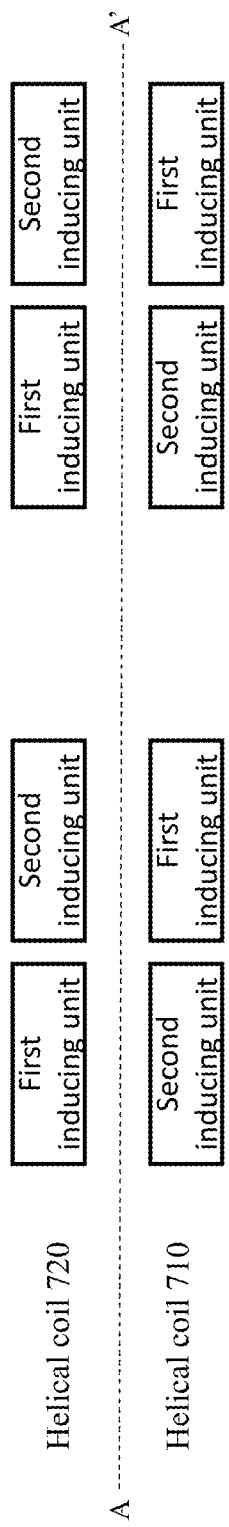
Figure 7C:
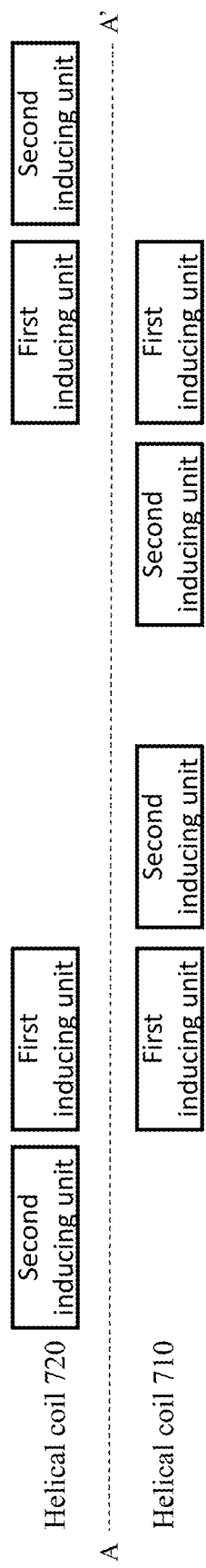

FIG. 7A illustrates the helical stacked integrated inductor according to another embodiment. The helical stacked integrated inductor 700 is similar to the helical stacked integrated inductor 400 as their input terminal and center tap are both located at the same side of the inductor, except that in the helical coil 710 and the helical coil 720, the metal segments at the side where the input terminal (or the center tap) exists and its opposite side (i.e., the two sides parallel to the cross section A-A') are staggered (i.e., the metal segments in the upper and lower layer are not correspondingly arranged), while the metal segments at the other two sides (i.e. the two side parallel to the cross section B-B') are correspondingly arranged. Refer to the cross-sectional views in FIGS. 7B and 7C (corresponding respectively to cross sections A-A' and B-B') for better understanding of the staggered arrangement and the corresponding arrangement mentioned above. In the cross-sectional view in FIG. 7B, the metal segments at the inner turn and the outer turn of the helical coil 710 correspond respectively to the metal segments at the inner turn and the outer turn of the helical coil 720 along the direction perpendicular to a plane where the helical coil 710 or the helical coil 720 exists. This arrangement in FIG. 7B is referred to as the corresponding arrangement. In the cross-sectional view in FIG. 7C, the metal segments at the outer turn of the helical coil 710 correspond to the metal segments at the inner turn of the helical coil 720 along the direction perpendicular to a plane where the helical coil 710 or helical coil 720 exists, but the metal segments at the inner turn of the helical coil 710 and the metal segments at the outer turn of the helical coil 720 do not correspond to any metal segments of the other helical coil. This arrangement in FIG. 7C is referred to as the staggered arrangement.

Figure 8:
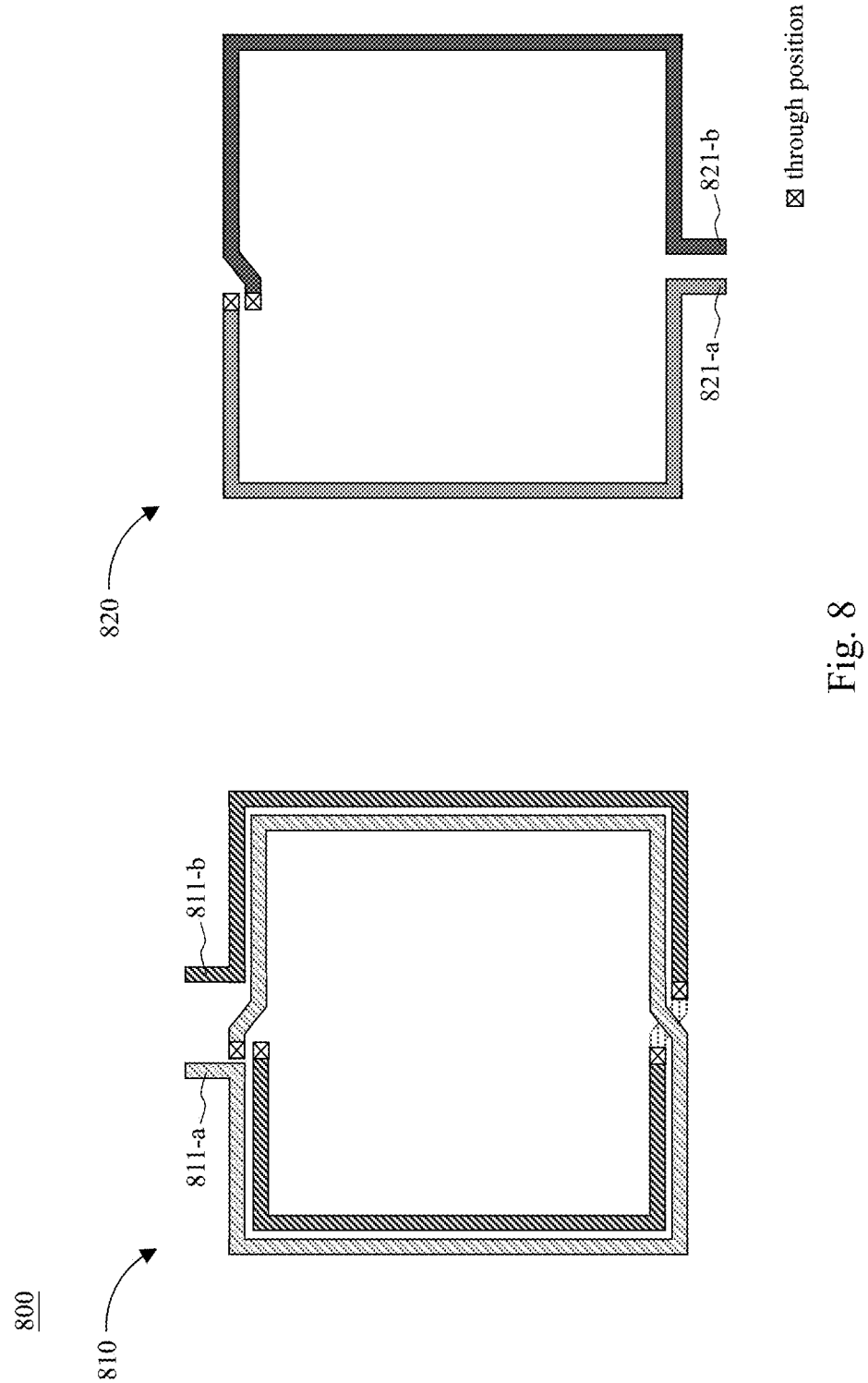
FIG. 8 illustrates a helical stacked integrated transformer according to an embodiment.

In addition to the helical stacked integrated inductor, a helical stacked integrated transformer is also disclosed. FIG. 8 illustrates a helical stacked integrated transformer according to an embodiment. The structure of the helical stacked integrated transformer in FIG. 8 is substantially similar to that of the helical stacked integrated inductor 100 in FIG. 1, except that the terminal 121 of the helical stacked integrated inductor 100 is replaced by the terminals 821-*a* and 821-*b* in the helical stacked integrated transformer 800. To be specific, the first inducing unit of the helical stacked integrated inductor 100 forms a first inductor in the helical stacked integrated transformer 800 (with the terminals 811-*a* and 821-*a* serving as the two terminals of the inductor), and the second inducing unit of the helical stacked integrated inductor 100 forms a second inductor in the helical stacked integrated transformer 800 (with the terminals 811-*b* and 821-*b* serving as the two terminals of the inductor). The first inductor and the second inductor together form a transformer with the terminals 811-*a* and 821-*a* serving as one port of the transformer and the terminals 811-*b* and 821-*b* serving as the other. In this embodiment, the terminals of the helical coil 810 and the terminals of the helical coil 820 are located at different sides of the helical stacked integrated transformer 800.

Figure 9:
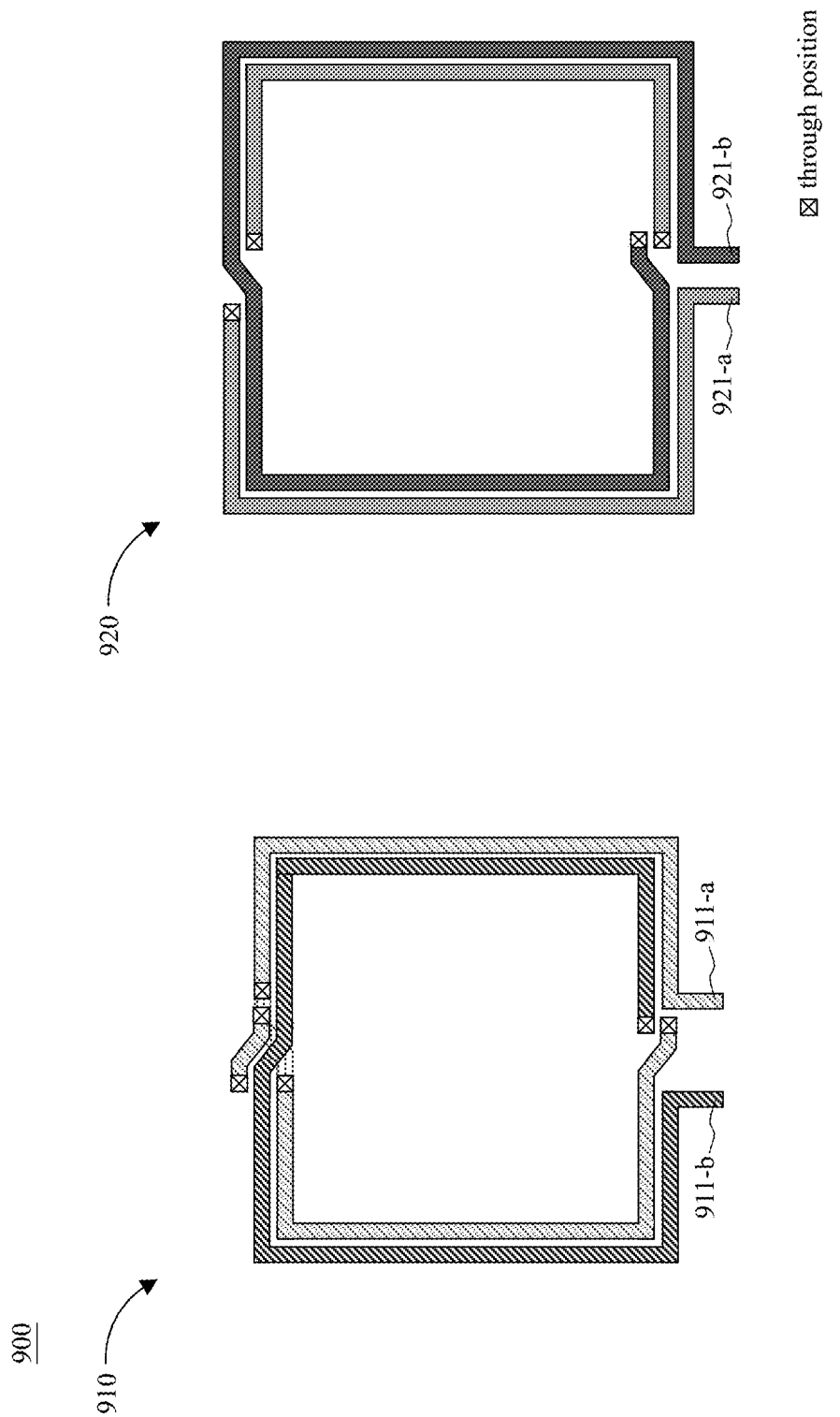
FIG. 9 illustrates a helical stacked integrated transformer according to another embodiment.

FIG. 9 illustrates the helical stacked integrated transformer according to another embodiment. The structure of the helical stacked integrated transformer is substantially similar to that of the helical stacked integrated inductor 400 in FIG. 4, except that the terminal 421 of the helical stacked integrated inductor 400 is replaced by the terminals 921-*a* and 921-*b* in the helical stacked integrated transformer 900. The terminals 911-*a* and 921-*a* form the two terminals of the first inductor, and the terminals 911-*b* and 921-*b* form the two terminals of the second inductor. In this embodiment, the terminal of the helical coil 910 and the terminal of the helical coil 920 are located at the same side of the helical stacked integrated transformer 900. Similarly, by modifying the center taps of the helical stacked integrated inductors 300 and 600 in FIGS. 3 and 6 to two terminals, corresponding helical stacked integrated transformers can be generated.

Note that the shape, size, ratio of any element, and the number of turns of the helical coils in the disclosed figures are exemplary for understanding, not for limiting the scope of this invention. In the aforementioned embodiments the helical coils are made as rectangles, but they can also be made as other polygons. Moreover, the width of the metal segment at each turn of the helical coil may differ from one another; for example, the width of the metal segment at the inner turn can be designed to be greater than the width of the metal segment at the outer turn. The quality factor (Q) of the inductor decreases as the radius of the coil becomes smaller. However, by increasing the width of the metal segment at the inner turn, the quality factor (Q) can be improved, which demonstrates a more significant effect than increasing the width of the metal segment at the outer turn.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A helical stacked integrated inductor, formed by a first inducing unit and a second inducing unit, comprising:
   a first helical coil, substantially located at a first plane and having a first outer turn and a first inner turn, wherein said first inner turn is surrounded by said first outer turn, and said first helical coil forms a part of said first inducing unit and a part of said second inducing unit; and
   a second helical coil, substantially located at a second plane different from said first plane, and sharing an overlapped region with said first helical coil, wherein said second helical coil forms a part of said first inducing unit and a part of said second inducing unit;
   wherein, at least one side of said first outer turn corresponds to a metal segment of said second helical coil along one direction, and at least one side of said first inner turn does not correspond to said metal segment of said second helical coil along said direction, said direction is a direction perpendicular to said first plane or said second plane;
   wherein said helical stacked integrated inductor has a first terminal, a second terminal and a third terminal, said first terminal and said second terminal are located at said first plane and at a first side of said helical stacked integrated inductor, said third terminal is located at said second plane and at a second side of said helical stacked integrated inductor, said first side is different from said second side, and there is one turn difference between said first helical coil and said second helical coil;

wherein said second helical coil has a second outer turn and a second inner turn, said second inner turn is surrounded by said second outer turn, said first terminal and said second terminal are located at said first outer turn, and said third terminal is located at said second outer turn.

2. The helical stacked integrated inductor of claim 1, wherein said first terminal and said third terminal are two terminals of said first inducing unit, said second terminal and said third terminal are two terminals of said second inducing unit, and said first inducing unit and said second inducing unit have no shared segment.

3. A helical stacked integrated inductor, formed by a first inducing unit and a second inducing unit, comprising:
   a first helical coil, substantially located at a first plane and having a first outer turn and a first inner turn, wherein said first inner turn is surrounded by said first outer turn, and said first helical coil forms a part of said first inducing unit and a part of said second inducing unit; and
   a second helical coil, substantially located at a second plane different from said first plane, and sharing an overlapped region with said first helical coil, wherein said second helical coil forms a part of said first inducing unit and a part of said second inducing unit;

wherein, at least one side of said first outer turn corresponds to a metal segment of said second helical coil along one direction, and at least one side of said first inner turn does not correspond to said metal segment of said second helical coil along said direction, said direction is a direction perpendicular to said first plane or said second plane;

wherein said helical stacked integrated inductor has a first terminal, a second terminal and a third terminal, said first terminal and said second terminal are located at said first plane and at a first side of said first helical coil, said third terminal is located at said second plane and at said first side of said second helical coil, and said first helical coil and said second helical coil have the same number of turns.

4. The helical stacked integrated inductor of claim 3, wherein said second helical coil has a second outer turn and a second inner turn, said second inner turn is surrounded by said second outer turn, said first terminal and said second terminal are located at said first outer turn, and said third terminal is located at said second outer turn.

5. The helical stacked integrated inductor of claim 3, wherein said first terminal and said third terminal are two terminals of said first inducing unit, said second terminal and said third terminal are two terminals of said second inducing unit, and said first inducing unit and said second inducing unit have no shared segment.

\* \* \* \* \*